(12) United States Patent
Nakamura et al.

(10) Patent No.: US 10,312,932 B2
(45) Date of Patent: Jun. 4, 2019

(54) SUCCESSIVE APPROXIMATION ANALOG-TO-DIGITAL CONVERTER

(71) Applicant: Hitachi, Ltd., Chiyoda-ku, Tokyo (JP)

(72) Inventors: Yohei Nakamura, Tokyo (JP); Taizo Yamawaki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/924,945

(22) Filed: Mar. 19, 2018

(65) Prior Publication Data

US 2019/0074845 A1 Mar. 7, 2019

(30) Foreign Application Priority Data

Sep. 1, 2017 (JP) .................................. 2017-168727

(51) Int. Cl.
*H03M 1/12* (2006.01)
*H03M 1/46* (2006.01)

(52) U.S. Cl.
CPC ........... *H03M 1/462* (2013.01); *H03M 1/125* (2013.01)

(58) Field of Classification Search
CPC .............................. H03M 1/125; H03M 1/462
USPC .................................................. 341/144–161
See application file for complete search history.

(56) References Cited

U.S. PATENT DOCUMENTS

| 8,193,957 B2* | 6/2012 | Yoshioka | ............... | H03M 1/462 |
| | | | | 341/118 |
| 2002/0008654 A1* | 1/2002 | Sakakibara | ......... | H03M 1/1225 |
| | | | | 341/162 |
| 2010/0079319 A1* | 4/2010 | Berens | ................ | H03M 1/1038 |
| | | | | 341/120 |
| 2010/0164767 A1* | 7/2010 | Oshima | ............... | H03M 1/1004 |
| | | | | 341/120 |
| 2011/0063147 A1* | 3/2011 | Yoshioka | .............. | H03M 1/462 |
| | | | | 341/118 |

(Continued)

FOREIGN PATENT DOCUMENTS

JP 2011-61597 A 3/2011

OTHER PUBLICATIONS

Marcus Yip et al. "A Resolution-Reconfigurable 5-to-10-Bit 0.4-to-1 V Power Scalable SAR ADC for Sensor Applications" IEEE Journal of Solid-State Circuits, vol. 48, No. 6, pp. 1453-1464, Jun. 2013.

*Primary Examiner* — Lam T Mai
(74) *Attorney, Agent, or Firm* — Crowell & Moring LLP

(57) ABSTRACT

The resolution of a successive approximation analog-to-digital converter is varied in a wide range. Provided is a successive approximation analog-to-digital converter including a digital-to-analog converter that generates an analog voltage based on a digital code, a comparator to which the analog voltage as the output of the digital-to-analog converter is inputted, a DAC control circuit that generates the digital code of an input voltage sampled from an external clock signal by successively changing the digital code based on the output of the comparator, a delay circuit that starts the determination of the comparator by signal transition generated by delaying the signal state change of the output of the comparator, a clock generation circuit that generates a signal starting the determination of the comparator, and a selector circuit that selects a signal generated by the delay circuit or a signal generated by the clock generation circuit to feed the selected signal to the comparator.

11 Claims, 12 Drawing Sheets

(56) References Cited

U.S. PATENT DOCUMENTS

| | | | | |
|---|---|---|---|---|
| 2011/0133971 A1* | 6/2011 | Ogawa | ............... | H03M 1/0678 |
| | | | | 341/155 |
| 2012/0133534 A1* | 5/2012 | Oshima | ............... | H03M 1/1052 |
| | | | | 341/110 |
| 2013/0120179 A1* | 5/2013 | Dedic | ................... | G11C 27/02 |
| | | | | 341/155 |
| 2013/0328709 A1* | 12/2013 | Chen | ....................... | H03M 1/12 |
| | | | | 341/172 |
| 2014/0062735 A1* | 3/2014 | Dasgupta | ............. | H03M 1/182 |
| | | | | 341/110 |
| 2014/0184434 A1* | 7/2014 | Chen | .................... | H03M 1/145 |
| | | | | 341/155 |
| 2016/0142068 A1* | 5/2016 | Oshima | ............... | H03M 1/1038 |
| | | | | 341/118 |

\* cited by examiner

SUCCESSIVE APPROXIMATION ANALOG-TO-DIGITAL CONVERTER

TECHNICAL FIELD

The present invention relates to a successive approximation analog-to-digital (AD) conversion technique.

BACKGROUND ART

It is expected that failure prediction and optimum operation methods are determined by disposing a plurality of sensors in factory equipment and the like to analyze data obtained from the sensors. To transmit, record, or process analog data obtained from the sensors, the analog data is converted to digital data by using an analog-to-digital converter (ADC) for performing analog-to-digital conversion (AD conversion).

Since a plurality of types of sensors are used in such a field, the ADC in the circuit of each of the sensors is required to appropriately change the resolution (the number of bits) and the sampling rate according to the sensor.

Non-patent Literature 1 proposes an ADC that can vary the resolution for responding to a plurality of different types of sensor signals by using a small-scale circuit. In addition, Patent Literature 1 proposes means for adjusting the delay amount in an asynchronous successive approximation AD converter.

CITATION LIST

Patent Literature
[Patent Literature 1]: Japanese Patent Application Laid-Open Publication No. 2011-061597
[Non-Patent Literature]
[Non-patent Literature 1]: Marcus Yip and Anantha P. Chandrakasan "A Resolution-Reconfigurable 5-to-10-Bit 0.4-to-1 V Power Scalable SAR ADC for Sensor Applications" IEEE Journal of Solid-State Circuits, vol. 48, no. 6, June 2013

SUMMARY OF INVENTION

Technical Problem

A successive approximation AD converter that can be typically operated at low electric power is suitable for a battery-driven sensor and the like. However, the operation rate in the interior of the AD converter is high with respect to the sampling rate, thereby requiring the high-speed control clock aside from the sampling clock. Consequently, the AD converter is not suitable for high-speed operation in view of electric power consumption.

Meanwhile, an asynchronous successive approximation AD converter that delays the output result of a comparator to generate the operation clock of the comparator is leading as a conversion method that enables high-speed operation at low electric power. The asynchronous successive approximation AD converter requires a delay circuit that allows the comparator to be non-operated and to wait during the stabilization period until the convergence of the input voltage of the comparator. The delay amount is required to be set to an appropriate value according to the characteristic of the designed ADC, and Patent Literature 1 proposes the means for adjusting the delay amount in the asynchronous successive approximation AD converter.

However, although the asynchronous successive approximation AD converter as described in Patent Literature 1 is suitable for high-speed operation, the asynchronous successive approximation AD converter is required to change the variable delay width of the delay circuit in a wide range in order to vary the resolution and the sampling rate over a wide range, resulting in increasing the circuit scale and the electric power.

Solution to Problem

In one aspect of the present invention, a successive approximation analog-to-digital converter has a plurality of capacitive elements that sample an analog input signal and have weighted capacitance values, a comparator that compares the analog input signal and a reference analog signal to output a comparison result, a plurality of registers that store digital data based on the comparison result, and a DAC that generates the reference analog signal based on the contents of the plurality of registers, and the analog input signal is converted to a digital code by successively changing the digital data based on the output of the comparator. The successive approximation analog-to-digital converter has a first timing signal generation unit that generates a first timing signal based on the output of an oscillation circuit, a second timing signal generation unit that generates a second timing signal based on the state change of the output of the comparator, and a selector circuit that selects the first timing signal or the second timing signal to feed the selected timing signal to the comparator.

In another aspect of the present invention, a successive approximation analog-to-digital converter includes a digital-to-analog converter that generates an analog voltage based on a digital code, a comparator to which the analog voltage as the output of the digital-to-analog converter is inputted, a DAC control circuit that generates the digital code of an input voltage sampled from an external clock signal by successively changing the digital code based on the output of the comparator, a delay circuit that starts the determination of the comparator by signal transition generated by delaying the signal state change of the output of the comparator, a clock generation circuit that generates a signal starting the determination of the comparator, and a selector circuit that selects a signal generated by the delay circuit or a signal generated by the clock generation circuit to feed the selected signal to the comparator.

Advantageous Effects of Invention

While the scale of the delay circuit can be prevented from being enlarged, the variable width of the resolution can be widened.

DESCRIPTION OF EMBODIMENTS

Figure 1:
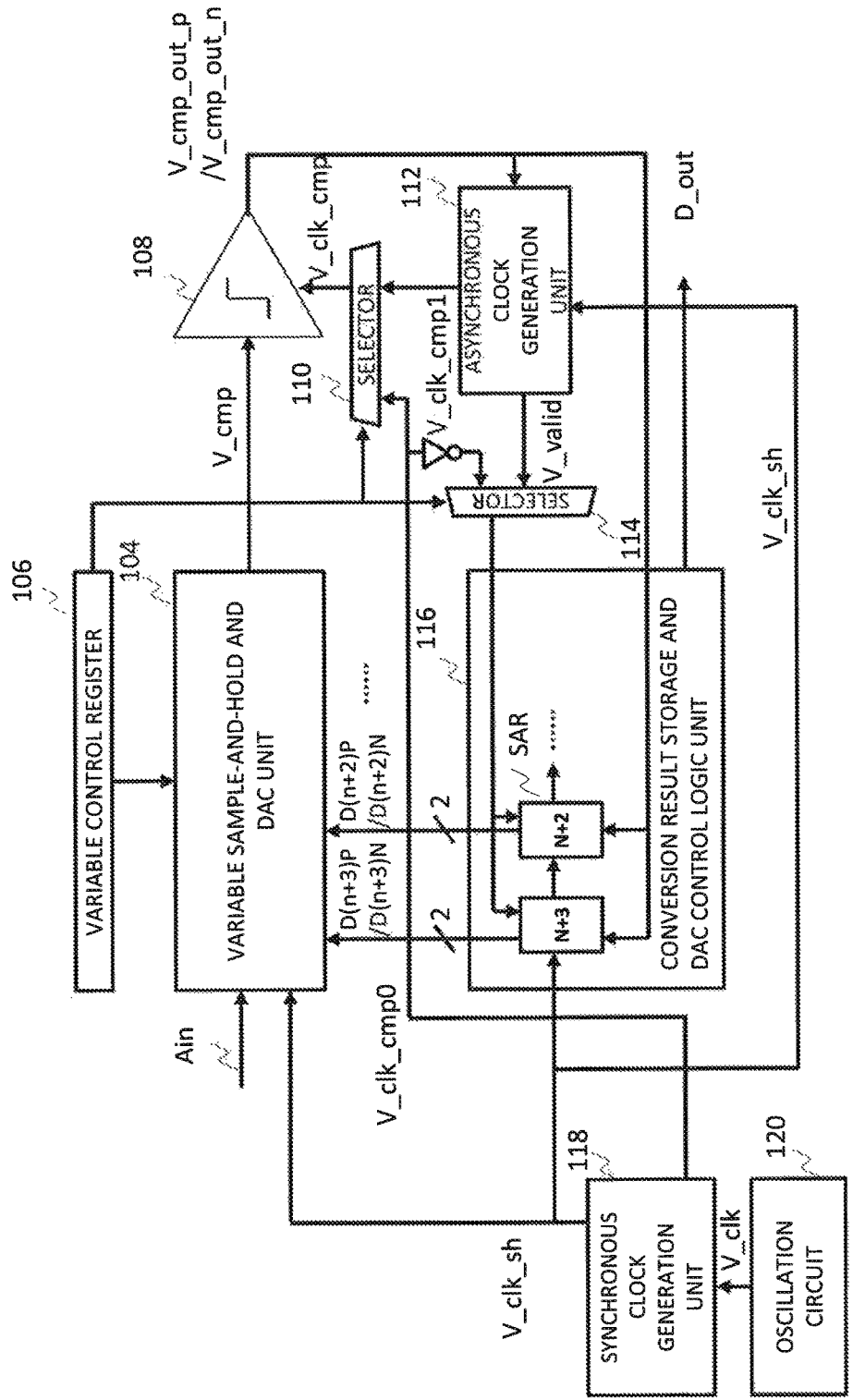
FIG. 1 is a block diagram of a successive approximation AD converter according to a first embodiment.

Embodiments will be described below in detail with reference to the drawings. However, the present invention is not construed to limit the described contents of the following embodiments. Those skilled in the art can easily understand that the specific configuration of the present invention can be changed within the scope not departing from the idea or purport of the present invention.

In the configuration of the invention described below, the same reference signs are shared for portions having the same portions or similar functions between the different drawings, and the overlapped description may be omitted.

When there are a plurality of elements that have the same or similar function, a different subscript may be given to the same reference sign for description. However, when it is not necessary to discriminate the plurality of elements, the subscript may be omitted for description.

The denotations of "first", "second", "third", and the like herein are given to identify components, and do not necessarily limit the number, order, or contents of the components. In addition, the numbers for identifying components are used in respective contexts, and the number used in one context does not necessarily indicate the same configuration in other contexts. Further, a component identified by a number is not prevented from serving as the function of components identified by other numbers.

To easily understand the invention, there is the case where the position, size, shape, range, and the like of each configuration illustrated in the drawings and the like do not represent the actual position, size, shape, range, and the like of the configuration. Therefore, the present invention is not necessarily limited to the position, size, shape, range, and the like of the configuration disclosed in the drawings and the like.

Unless the context otherwise clearly indicates, components represented in the singular herein include the plural.

In the overview of an example of the embodiments described below in detail, a successive approximation AD converter can switch between a synchronous mode that generates the comparison start signal of a comparator by an external clock and an asynchronous mode that generates the comparison start signal of the comparator from the output result of the comparator. The successive approximation AD converter can select, as a comparator drive clock, one of a comparator drive clock generated by delaying a signal generated based on the output result of the comparator and a comparator drive clock generated by a clock generation circuit, according to the set value of a register.

First Embodiment

FIG. 1 is a block diagram of the successive approximation AD converter according to a first embodiment. An analog input signal Ain is inputted to a variable sample-and-hold and DAC unit 104. The variable sample-and-hold and DAC unit 104 includes a variable sample-and-hold circuit that can sample and hold the voltage level of the analog input signal Ain based on a variable bit, and a digital-to-analog converter (DAC) that outputs an analog voltage based on the output of a conversion result storage and DAC control logic unit 116. The successive approximation AD converter can be operated in two modes of the synchronous mode and the asynchronous mode. In addition, the sampling rate may be variable.

The variable sample-and-hold circuit samples and holds the input analog voltage Ain during the period in which a sample-and-hold clock V_clk_sh is High, and digitizes the sampled and held analog signal Ain during the period in which the sample-and-hold clock V_clk_sh is Low. In this embodiment, the resolution of the voltage level to be sampled and held can be changed by a variable control register 106.

A comparator 108 to which the output of the variable sample-and-hold and DAC unit 104 is inputted compares the output of the variable sample-and-hold and DAC unit 104 and a reference voltage, and outputs a logic signal V_cmp_out_p that is High when the comparator input is larger than the reference voltage and is Low when the comparator input is smaller than the reference voltage, and a logic signal V_cmp_out_n that is High when the comparator input is smaller than the reference voltage and is Low when the comparator input is larger than the reference voltage.

The conversion result storage and DAC control logic unit 116 includes registers SAR (Successive Approximation Register) that represent a plurality of digital bits. To the registers SAR, inputted are the sample-and-hold clock V_clk_sh generated from a synchronous clock generation unit 118, the signals V_cmp_out_p and V_cmp_out_n that represent the output results of the comparator 108, and a timing control signal that controls the fetching timing of the outputs of the comparator 108 into the registers SAR. As described later, the timing control signal is different between the synchronous mode and the asynchronous mode.

The conversion result storage and DAC control logic unit 116 includes the registers SAR that represent a plurality of digital bits. For example, in this embodiment, four registers SAR that are represented as N+3, N+2, N+1, and N represent 4 bits. This configuration responds to the configuration of the variable sample-and-hold and DAC unit 104. The number of bits is arbitrary, and may be more than or less than 4. The registers SAR rewrite their contents according to the results of the comparator 108 that successively come out. The final state of the registers SAR is an AD conversion result D_out.

The content of each of the registers SAR also designates an analog voltage that is to be outputted by the DAC of the variable sample-and-hold and DAC unit 104. Thus, the register SAR outputs a control signal that controls the DAC of the variable sample-and-hold and DAC unit 104 (DkP/DkN (k is the number of bits for conversion)). The control signal outputs the value of the register SAR as-is. That is, when data is fetched into the predetermined register SAR by the timing control signal and is rewritten, the changed content of the register is outputted.

The synchronous clock generation unit 118 frequency—divides an output V_clk of an oscillation circuit 120 to generate the sample-and-hold clock V_clk_sh. In addition, the synchronous clock generation unit 118 frequency-divides the V_clk or uses the V_clk as-is to generate a synchronous clock V_clk_cmp0. The sample-and-hold clock V_clk_sh is fed into the variable sample-and-hold and DAC unit 104 and the conversion result storage and DAC control logic unit 116, and controls the timings of the sampling-and-holding and successive approximation of the analog input signal Ain. The synchronous clock V_clk_cmp0 is used for the control timing of the comparator 108 and the register SAR in the synchronous mode.

An asynchronous clock generation unit 112 generates an asynchronous clock V_clk_cmp1 and a conversion completion signal V_valid based on the outputs V_cmp_out_p and V_cmp_out_n of the comparator 108 and the sample-and-hold clock V_clk_sh.

As for the comparator 108, two modes of the synchronous mode and the asynchronous mode are enabled in such a manner that the synchronous clock V_clk_cmp0 or the asynchronous clock V_clk_cmp1 is used by being selected by a selector 110. The switching control of the selector 110 and a selector 114 is performed by the variable control register 106. In place of the variable control register 106, control means such as a microcomputer may be used. The synchronous clock V_clk_cmp0 or the asynchronous clock V_clk_cmp1 that is switched by the selector 110 and is inputted to the comparator 108 is called a comparator control clock V_clk_cmp.

To the conversion result storage and DAC control logic unit 116, the selector 114 selects and inputs the clock that controls the fetching timing of the register SAR of the conversion result storage and DAC control logic unit 116 from the synchronous clock V_clk_cmp0 or the conversion completion signal V_valid.

As described above, the operation timing of the comparator 108 and the fetching timing of the output of the comparator 108 into the register SAR of the conversion result storage and DAC control logic unit can be controlled by selecting the synchronous mode that controls the timings by the synchronous clock derived from the oscillation circuit 120 or the asynchronous mode that controls the timings by the asynchronous clock based on the output of the comparator 108 or the sample-and-hold clock V_clk_sh.

Figure 2:
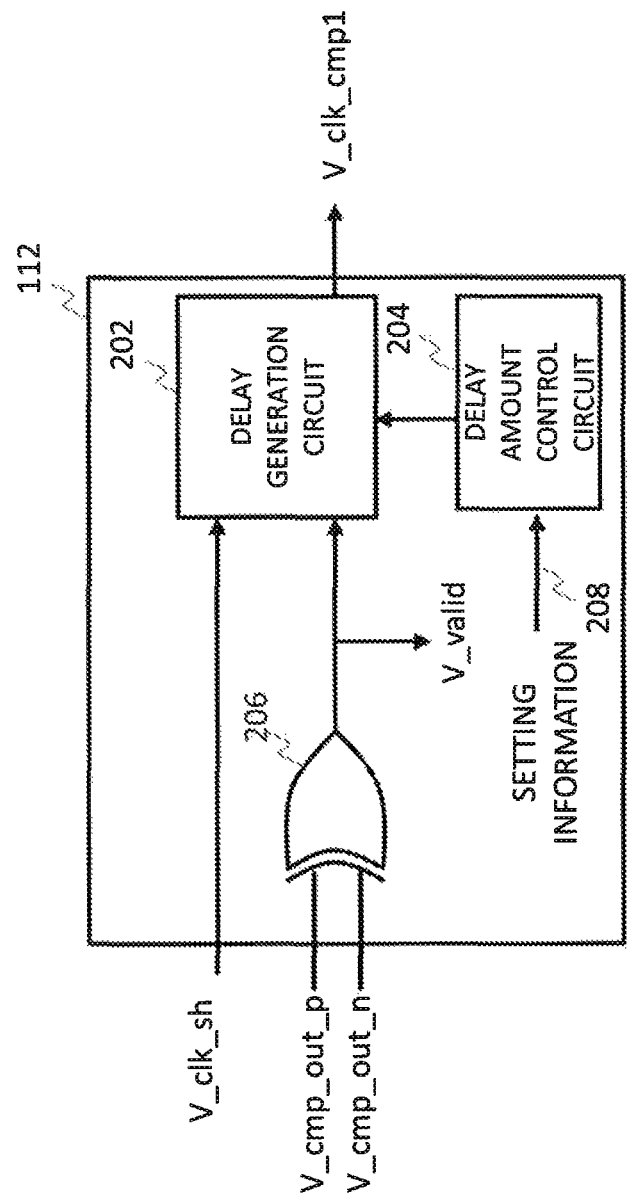
FIG. 2 is a circuit diagram illustrating an example of an asynchronous clock generation unit according to the first embodiment.

FIG. 2 illustrates an example of the configuration of the asynchronous clock generation unit 112. As illustrated in FIG. 1, to the asynchronous clock generation unit 112, inputted are the sample-and-hold clock V_clk_sh that is generated from the synchronous clock generation unit 118 and the signals V_cmp_out_p and V_cmp_out_n that represent the output results of the comparator 108. From the asynchronous clock generation unit 112, outputted are the asynchronous clock V_clk_cmp1 that operates the comparator 108 in the asynchronous mode and the conversion completion signal V_valid.

The asynchronous clock generation unit 112 includes a delay generation circuit 202, a delay amount control circuit 204, and an exclusive OR (XOR) gate 206. The XOR gate 206 generates the conversion completion signal V_valid representing that voltage comparison by the comparator 108 has been completed, from the exclusive OR of the output results V_cmp_out_p and V_cmp_out_n of the comparator 108. That is, the XOR gate 206 outputs High when the comparison result outputs V_cmp_out_p and V_cmp_out_n of the comparator 108 are at different levels, and outputs Low when the comparison result outputs V_cmp_out_p and V_cmp_out_n of the comparator 108 are at the same level. The V_cmp_out_p and the V_cmp_out_n are ideally exclusive signals, so that when the comparator 108 is stably operated, the output of the XOR gate 206 should be High. Therefore, the output of the XOR gate 206 is High, so that the conversion completion signal V_valid representing that the comparator 108 has completed comparison can be generated.

The delay generation circuit 202 generates the asynchronous clock V_clk_cmp1 by delaying the conversion completion signal V_valid, or the completion timing of the sampling period of the sample-and-hold clock V_clk_sh. The V_clk_cmp1 is inputted to the comparator 108 to reset the same. In addition, the conversion completion signal V_valid controls the fetching timing of the register SAR of the conversion result storage and DAC control logic unit 116. It is to be noted that instead of the conversion completion signal V_valid, the sample-and-hold clock V_clk_sh can be delayed to control the fetching timing of the register SAR.

The delay amount control circuit 204 includes, for example, a microcomputer, and controls the delay amount of the delay generation circuit 202 based on delay amount setting information 208 from the outside. It is to be noted that the delay amount may be changed according to the resolution of the voltage level to be sampled and held, that is, the number of stages of the successive approximation AD converter. Typically, when the number of stages of the successive approximation AD converter is increased, the capacitance is increased, so that the delay amount is required to be large.

As a specific preferred configuration example, preferably, the variable control register 106 is made to have a control circuit function as a microcomputer configuration, the control of switches $S_A$ and $S_B$ of the variable sample-and-hold and DAC unit 104 described later, the switching of the selectors 110 and 114, and the control of the delay amount of the delay generation circuit 202 are performed synchronously. Since the AD converter is configured in such a manner, the parameters of the respective circuits are matched to improve the performance of the AD converter.

Figure 3:
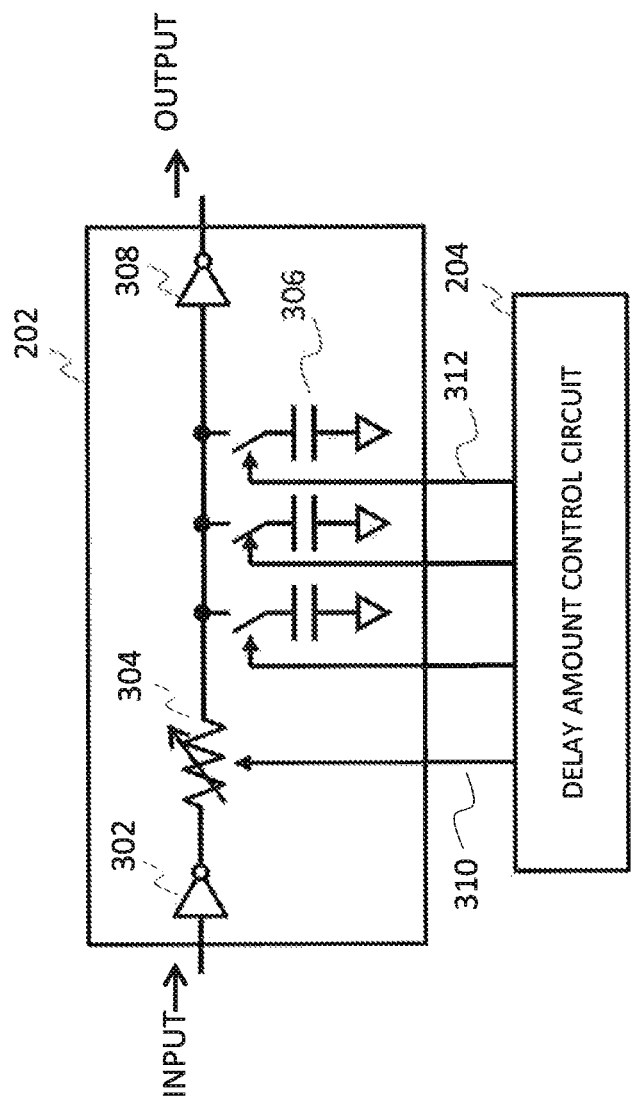
FIG. 3 is a circuit diagram illustrating an example of a delay generation circuit according to the first embodiment.

FIG. 3 illustrates an example of the configuration of the delay generation circuit 202. The delay generation circuit 202 in FIG. 3 has an inverter 302, a variable resistor 304, and variable capacitors 306 that are connected to the variable resistor 304 in parallel and can switch the number of connections by switches. Then, the input signal that is delayed by the variable resistor 304 and the variable capacitors 306 (the sample-and-hold clock V_clk_sh or the conversion completion signal V_valid) is inverted in polarity by an inverter 308, and is outputted. In addition, a control signal 310 of the resistance value of the variable resistor 304 and control signals 312 that switch the number of connections of the variable capacitors 306 are fed from the delay amount control circuit 204.

In the delay generation circuit 202 in FIG. 3, the delay of the input signal is achieved by RC delay by the variable resistor 304 and the capacitors 306. As another configuration example of the delay generation circuit 202, the input signal can also be delayed by circuit delay by using cascaded inverter circuits and the like, which can vary the amount of electric current.

Figure 4:
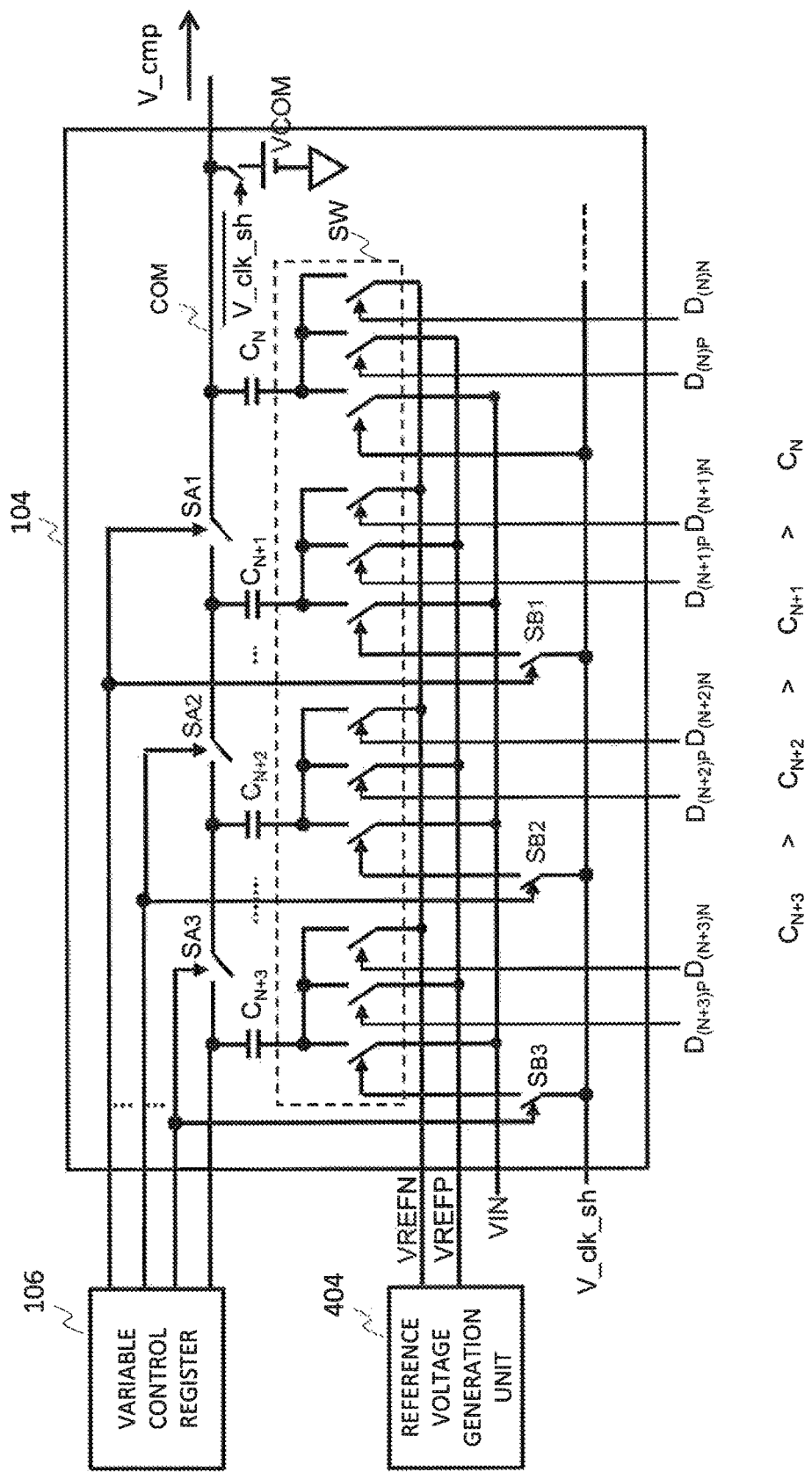
FIG. 4 is a circuit diagram illustrating an example of a variable sample-and-hold and DAC circuit according to the first embodiment.

FIG. 4 illustrates the configuration example of the variable sample-and-hold and DAC unit 104. Capacitors ($C_{N+3}$, $C_{N+2}$, ... ) configuring the DAC are scaled so as to be smaller from the higher-order toward the lower-order, and are represented as $C_{k+1}=\alpha k*C_k$. Typically, $\alpha k=2$ is used, but may be $\alpha k<2$ to have redundancy. In FIG. 4, for simplification, the number of capacitors C is four, but is arbitrary.

Each of the capacitors C is connected to the input node of the comparator 108. The respective capacitors C can be disconnected by switches $S_{A1}$, $S_{A2}$, $S_{A3}$, $S_{B1}$, $S_{B2}$, and $S_{B3}$ that are controlled by the variable control register 106. With this, the adjustment of quantization noise by the scaling of the number of conversions of an input voltage VIN (the voltage of the analog input signal Ain) and the adjustment of sampling thermal noise by the scaling of the total sampling capacitance ($\Sigma C_k$) are enabled. By enabling such variable sampling and holding, for example, the characteristic of the AD converter can be adapted to analog signals having various characteristics obtained from various sensors.

The sample-and-hold clock V_clk_sh samples and holds the analog input signal by connecting the capacitor C to the VIN during the sampling period in which the sample-and-hold clock V_clk_sh is High, and by the falling of the V_clk_sh to Low, the capacitor C is disconnected from the VIN and is connected to a reference voltage VCOM, so that the successive approximation of the AD converter is started. A reference voltage generation unit 404 generates a first reference voltage VREFP and a second reference voltage VREFN, and these reference voltages are supplied by a switch circuit SW to the capacitor C according to the content of the register SAR during the successive approximation period in which the sample-and-hold clock V_clk_sh is Low.

The overview of the operation of the AD conversion will be described. The variable sample-and-hold and DAC unit 104 first switches the switches $S_A$ and $S_B$ by the variable control register 106, and sets a desired number of capacitors C. When all the switches $S_A$ and $S_B$ are ON, $C_{N+3}$ is MSB (the most significant bit) and $C_N$ is LSB (the least significant bit), so that a 4-bit AD converter is configured. Here, when $S_{A3}$ and $S_{B3}$ are turned OFF to disconnect $C_{N+3}$, $C_{N+2}$ becomes the MSB, so that a 3-bit AD converter is configured. In this manner, the resolution (the number of bits) can be varied by disconnecting the switch on the MSB side.

Each of the switches configuring the switch circuit SW selectively connects one end of each of the capacitors ($C_{N+3}$, $C_{N+2}$, ... ) to the input voltage VIN, the first reference voltage VREFP, or the second reference voltage VREFN. Each of the switches connects the capacitor C to the VIN during the sampling period in which the sample-and-hold clock V_clk_sh is High. In addition, in successive approximation in which the sample-and-hold clock V_clk_sh is Low, each of the switches is switched according to the content of the register SAR of the conversion result storage and DAC control logic unit 116.

The comparator 108 compares the input voltage and the reference voltage from a common line COM, and outputs its comparison result signals. The reference voltage VCOM is set to the middle value between the first reference voltage VREFP and the second reference voltage VREFN. That is, VCOM=(VREFP+VREFN)/2.

The conversion result storage and DAC control logic unit 116 has therein the register SAR for successive approximation. The switch circuit SW includes analog switches, which is turned on and off by the signals $D_{KP}$ and $D_{KN}$ from the register SAR. The signal $D_{KP}$ is High when the content of the register is High ("1"), and is Low when the content of the register is Low ("0"), and the $D_{KN}$ is High when the content of the register is Low ("0"), and is Low when the content of the register is High ("1"). The switch circuit SW connects the capacitor C to the first reference voltage VREFP when the $D_{KP}$ is High, and connects the capacitor C to the second reference voltage VREFN when the $D_{KN}$ is High.

The conversion operation of the AD converter of this embodiment is the same as the conventional successive approximation AD converter. The conversion operation of the AD converter of this embodiment will be described below by taking the case where all the switches $S_A$ and $S_B$ are ON (in the case of the 4-bit AD converter) as an example. In the sampling process, the variable sample-and-hold and DAC unit 104 disconnects the common line COM from the reference voltage VCOM, and the sample-and-hold clock V_clk_sh controls the switch circuit SW to connect the capacitors ($C_{N+3}$, $C_{N+2}$, ... ) to the input voltage VIN. With this, the capacitors C are charged to the voltage (VIN-VCOM). After time sufficient for charging defined by the sample-and-hold clock V_clk_sh elapses, the switch circuit SW disconnects the capacitors ($C_{N+3}$, $C_{N+2}$, ... ) from the input voltage VIN. With this, the capacitors C are brought into the floating state to hold the charged electric charge.

Subsequently, the conversion result storage and DAC control logic unit 116 executes the successive approximation process. In the successive approximation process, the common line COM is connected to the reference voltage VCOM. In the first comparison process for determining the most significant bit (MSB), that is, the fourth bit, the capacitor $C_{N+3}$ is connected to the first reference voltage VREFP, and other capacitors $C_{N+2}$, $C_{N+1}$ and $C_N$ are connected to the second reference voltage VREFN. With this, the electric charge that is charged to the respective capacitors C in the sampling process are re-distributed to determine a voltage Vcmp of the common line COM.

The conversion result storage and DAC control logic unit 116 sets the register N+3 as the MSB of the register SAR to "1" when the output signal of the comparator 108 is High, and as a result, $D_{(N+3)P}$ is High and $D_{(N+3)N}$ is Low, so that the switch circuit SW is controlled so as to hold the capacitor $C_{N+3}$ corresponding to the MSB on the VREFP side. On the other hand, when the output signal of the comparator 108 is Low, the conversion result storage and DAC control logic unit 116 sets the register N+3 to "0", and connects the capacitor $C_{N+3}$ to the second reference voltage VREFN.

Subsequently, in the second comparison process for determining the third bit, the capacitor $C_{N+2}$ is switched from the above switch state to the first reference voltage VREFP side. The capacitor $C_{N+3}$, is connected to the first reference voltage VREFP (in the case where MSB="1"), or the second reference voltage VREFN (in the case where MSB="0"). In addition, other capacitors $C_{N+1}$ and $C_N$ are connected to the second reference voltage VREFN. With this, the electric charge is re-distributed again between the respective capacitors C to determine the voltage Vcmp of the common line COM.

The conversion result storage and DAC control logic unit 116 sets the register N+2 as the third bit of the register SAR to "1" when the output signal of the comparator 108 is High, and connects the capacitor $C_{N+1}$ to the first reference voltage VREFP. On the other hand, the conversion result storage and DAC control logic unit 116 sets the register N+2 to "0" when the output signal of the comparator 108 is at the L level, and connects the capacitor $C_{N+1}$ to the second reference voltage VREFN. In this manner, the bits of all of the registers SAR are set to set the connection of all the capacitors C. The final content of the registers SAP is the AD conversion result.

It is to be noted that in the above description, the switches $S_A$ and $S_B$ are all ON, and all the capacitors C are connected, but any capacitor C that disconnected by the switches $S_A$ and $S_B$ is not charged.

Figure 5:
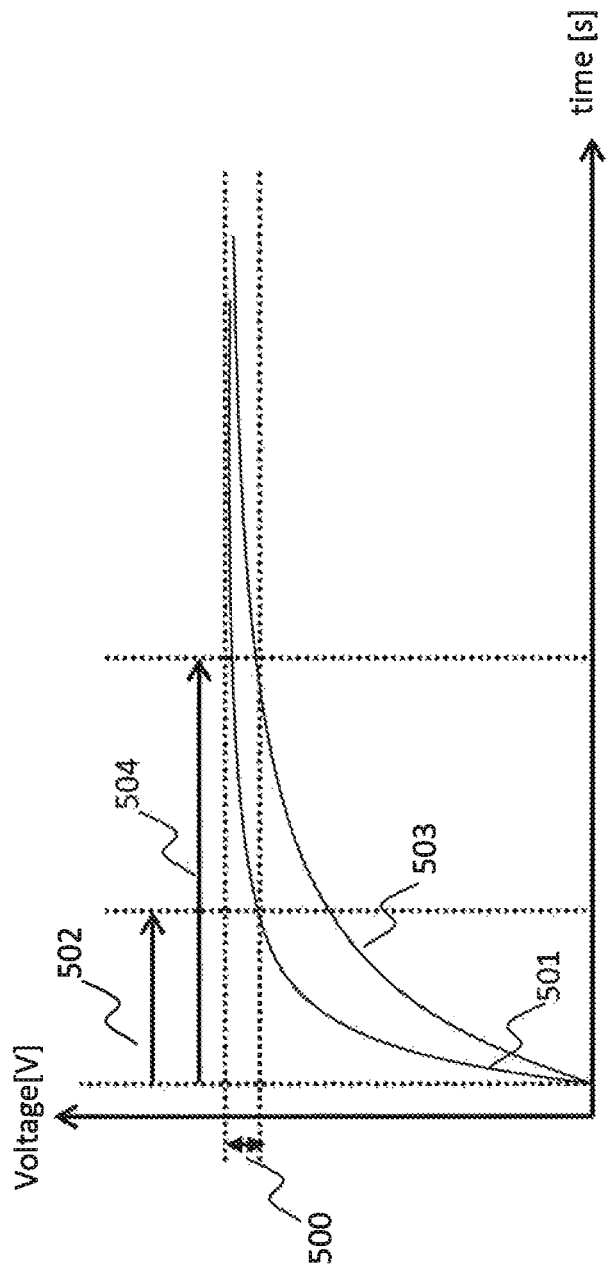
FIG. 5 is a waveform chart of assistance in explaining the convergence waveform of comparator outputs changed according to the number of stages of the DAC.

FIG. 5 is the waveform chart of the comparator input V_cmp to the comparator 108 when successive approximation is started when the capacitor C is disconnected by the switches $S_A$ and $S_B$ to change the number of stages of the AD converter. For the convergence time taken until the convergence to a convergence allowable error 500 determined by design, for example, convergence time 504 of a waveform 503 when the (N+1)th capacitance value is connected is longer than convergence time 502 of a waveform 501 when the Nth capacitance value is connected. That is, as the total capacitance value of the AD converter is increased, the convergence time tends to be increased. Therefore, it is desired that when the number of stages is changed, the waiting time from the operation of the DAC to the start of the comparison of the comparator is also changed. The detail of the operations in the asynchronous mode and the synchronous mode will be described below.

Figure 6:
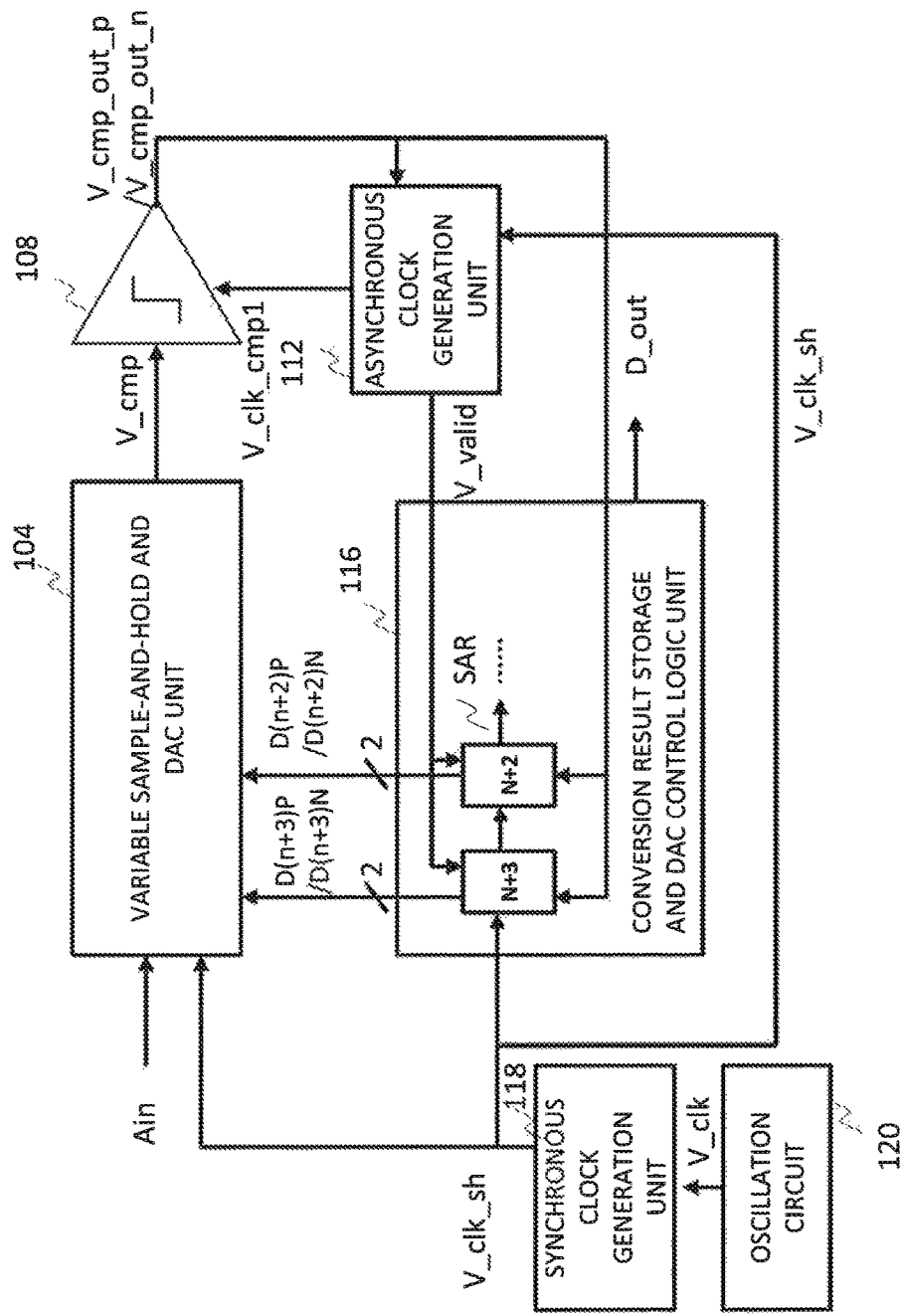
FIG. 6 is a block diagram of assistance in explaining the operation of the successive approximation AD converter according to the first embodiment in an asynchronous mode.

In FIG. 6, the selectors 110 and 114 are omitted from FIG. 1 for simply describing the operation in the asynchronous mode. In the asynchronous mode, the clock that controls the comparator 108 is the asynchronous clock V_clk_cmp1 generated by the asynchronous clock generation unit 112. In addition, the data rewriting timing of the register SAR of the conversion result storage and DAC control logic unit 116 is controlled by the conversion completion signal V_valid.

Figure 7:
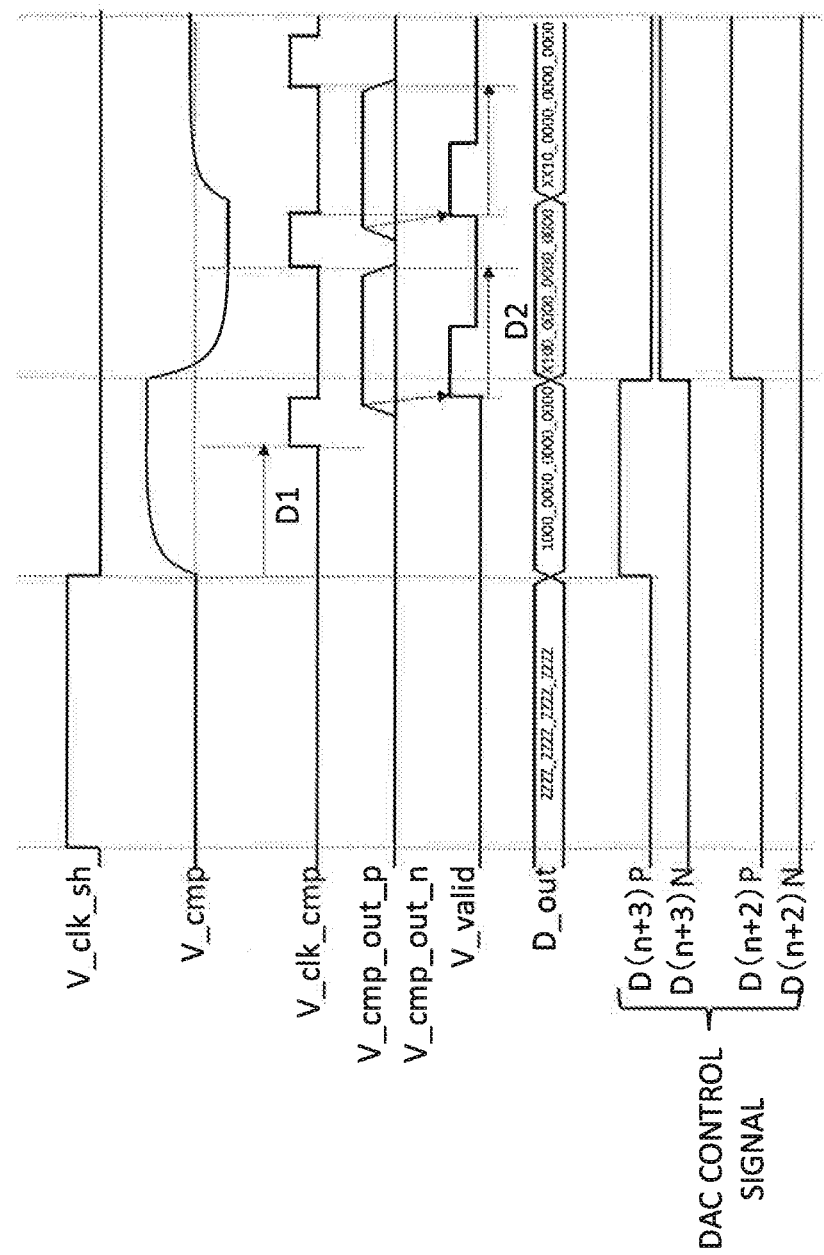
FIG. 7 is a waveform chart illustrating a time chart when the successive approximation AD converter according to the first embodiment is operated in the asynchronous mode.

FIG. 7 is the operation time chart in the asynchronous mode in successive approximation. In the drawing, a 4-bit operation is assumed. Dn+3P and Dn+3N are inputted from the conversion result storage and DAC control logic unit 116 to the variable sample-and-hold and DAC unit 104 at the falling timing of the sample-and-hold clock V_clk_sh inputted from the synchronous clock generation unit 118 to the conversion result storage and DAC control logic unit 116, and the DAC starts the operation. With this, as described with reference to FIG. 4, the capacitor $C_{N+3}$ is connected to the reference voltage VREFP, other capacitors are connected to the VREFN to re-distribute electric charge, the voltage V_cmp of the common line COM is determined, and the voltage is inputted to the comparator 108.

As illustrated in FIG. 7, the V_cmp starts convergence, the comparator control clock V_clk_cmp generated by the asynchronous clock generation unit 112 (that is, the asynchronous clock V_clk_cmp1) rises after the elapse of fixed time D1 from the falling of the sample-and-hold clock V_clk_sh, the comparator 108 starts comparison, and outputs the results V_cmp_out_p and V_cmp_out_n.

The delay generation circuit generates the conversion completion signal V_valid based on the V_cmp_out_p and the V_cmp_out_n, notifies the completion of the comparison, and determines the bit at that timing. The comparator control clock V_clk_cmp rises again after the elapse of fixed time D2 from the rising of the V_valid, and the comparison of the next stage is executed. Thereafter, this is repeated until the least significant bit. At this time, the conversion completion signal V_valid determines the fetching timing of the register SAR in the conversion result storage and DAC control logic unit 116. Then, when the V_cmp_out_p is High and the V_cmp_out n is Low, the register content is "1", and when the V_cmp_out_p is Low and the V_cmp_out_n is High, the register content is "0".

In the asynchronous mode, the asynchronous clock cmp1 can be generated by the delay generation circuit 202 illustrated in FIGS. 2 and 3, so that the delay time can be varied.

As described with reference to FIG. 5, the necessary delay amount is increased by increasing the number of comparisons, but as seen in FIG. 3, the area of the delay generation circuit 202 is increased with the variable width of the necessary delay amount, and is limited. Accordingly, when the number of comparisons is increased more than the predetermined threshold value, the AD converter is operated in the synchronous mode described below, thereby responding to the necessary delay amount while the circuit scale is avoided from being increased.

Figure 8:
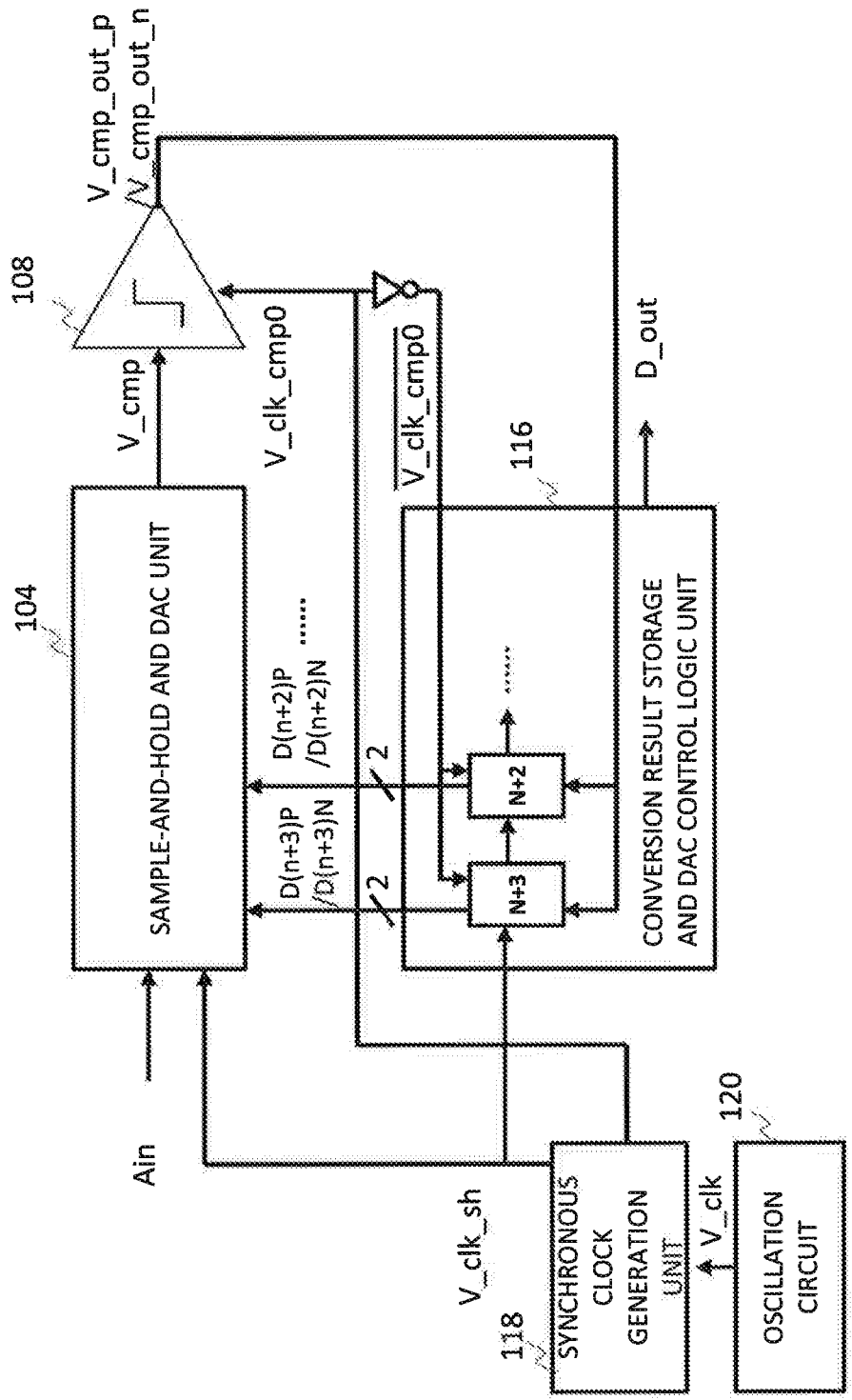
FIG. 8 is a block diagram of assistance in explaining the operation of the successive approximation AD converter according to the first embodiment in a synchronous mode.

In FIG. 8, the selectors 110 and 114 are omitted from FIG. 1 for simply describing the operation in the synchronous mode. In the synchronous mode, the clock that controls the comparator 108 is the synchronous clock V_clk_cmp0 generated by the synchronous clock generation unit 118. In addition, the data rewriting timing of the register SAR of the conversion result storage and DAC control logic unit 116 is also controlled by the synchronous clock V_clk_cmp0.

Figure 9:
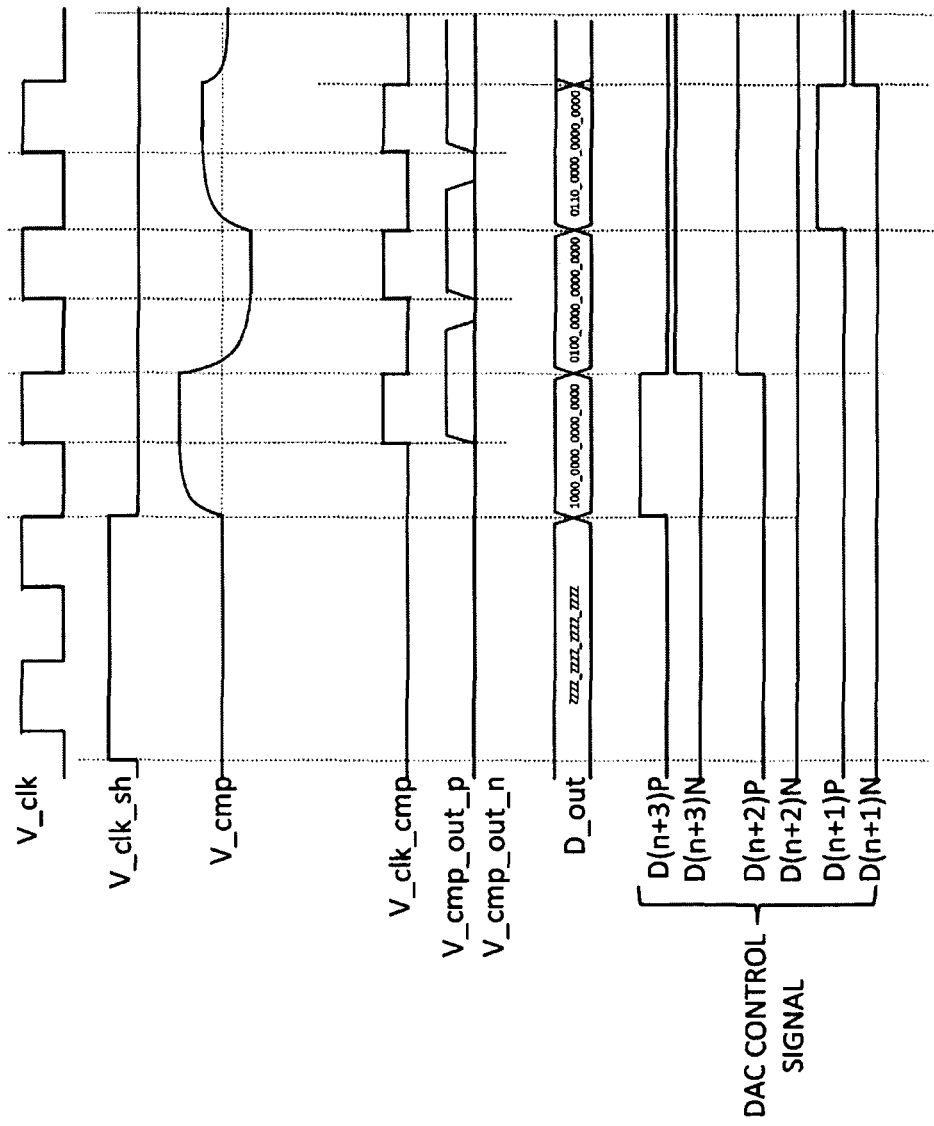
FIG. 9 is a waveform chart illustrating a time chart when the successive approximation AD converter according to the first embodiment is operated in the synchronous mode.

FIG. 9 is an operation time chart in the synchronous mode in successive approximation. Like the asynchronous mode in FIG. 7, after the falling of the sample-and-hold clock V_clk_sh generated by the synchronous clock generation unit 118, the DAC of the sample-and-hold and DAC unit 104 starts the operation, and the input signal V_cmp of the comparator 108 starts convergence. The comparator 108 starts comparison according to the rising of the comparator control clock V_clk_cmp generated by the synchronous clock generation unit 118 based on the output V_clk of the oscillation circuit 120 (that is, the synchronous clock V_clk_cmp0), and outputs the comparison results V_cmp_out_p and V_cmp_out_n. In the example in FIG. 9, after the falling of the V_clk_sh, the comparison is started according to the rising of the comparator control clock V_clk_cmp after the elapse of half the cycle, but the rising (or falling) in any cycle is used, and the delay time can be arbitrarily set.

The conversion result storage and DAC control logic unit 116 fetches the output results of the comparator 108 according to the falling of the V_clk_cmp, and operates the next stage of the DAC. Likewise, the comparator executes the comparison at the rising of the comparator control clock V_clk_cmp, and the conversion result storage and DAC control logic unit fetches the outputs of the comparator 108 with the falling of the comparator control clock V_clk_cmp.

The synchronous mode can change the convergence waiting time of the comparator 108 according to the cycle of the synchronous clock V_clk_cmp0, so that the variable width can be largely taken. Meanwhile, the high-speed clock is required to be fed from the synchronous clock generation unit 118 during high-speed operation, and the highest operation speed of the device, such as a transistor, is limited, so that the range for operating the AD converter at high speed is limited. It is possible to cope with such a case by switching to the asynchronous mode. For example, during the operation at a high resolution, the number of bits of the variable sample-and-hold unit is increased to increase the capacitance, so that the stabilization time of the comparator 108 becomes longer. On the contrary, the delay time can be extended to some extent in the asynchronous mode, but when the delay time becomes longer than the predetermined time, it is possible to cope with this by changing to the synchronous mode.

Therefore, in one configuration proposed in this embodiment, the selector circuit is switched with the changing of the number of bits of the variable sample-and-hold unit, thereby switching the clock that controls the comparator 108. As a specific example, the selector circuit selects the synchronous clock V_clk_cmp0 when the number of bits of a digital code is equal to or more than the predetermined threshold value, and selects the asynchronous clock V_clk_cmp1 when the number of bits of the digital code is less than the predetermined threshold value, thereby generating the comparator control clock V_clk_cmp.

Second Embodiment

In the first embodiment, to switch between the asynchronous mode and the synchronous mode, the selectors 110 and 114 are used. With this, the delay time by the asynchronous clock can be avoided from being limited, but due to the presence of the selectors, critical paths are formed so that signal delay may occur. In addition, the data rewriting timing of the register SAR that is controlled by the synchronous clock V_clk_cmp0 may be required to be adjusted.

Figure 10:
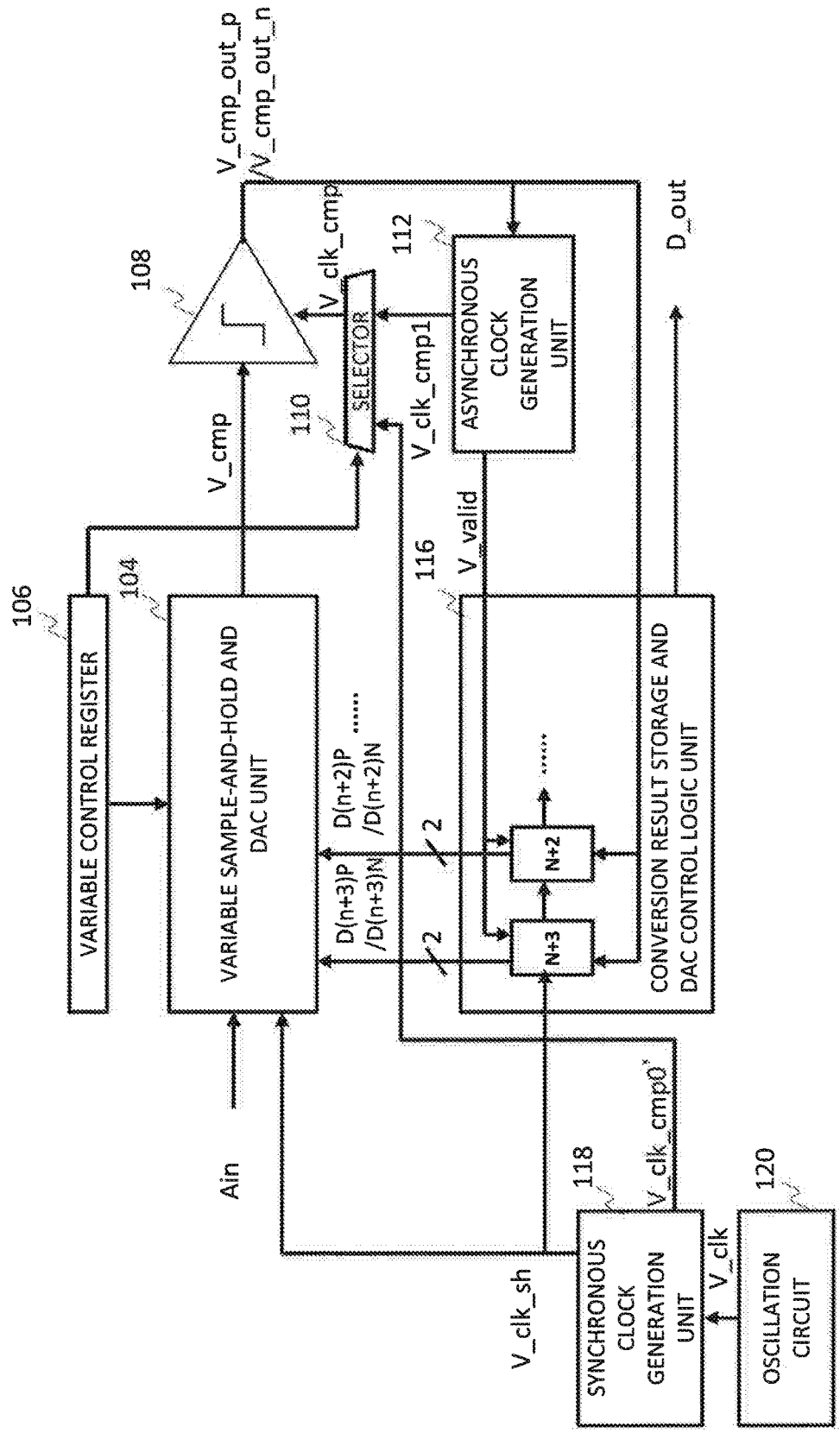
FIG. 10 is a block diagram of the successive approximation AD converter according to a second embodiment.

FIG. 10 illustrates the operation form of the successive approximation AD converter according to a second embodiment. The point different between the first embodiment and this embodiment will be described. In this embodiment, the conversion completion signal V_valid is directly fed from the asynchronous clock generation unit 112 to the conversion result storage and DAC control logic unit 116 not via the selector. That is, the conversion result storage and DAC control logic unit 116 does not use a synchronous clock V_clk_cmp0'. The operation in the asynchronous mode of the second embodiment is the same as the first embodiment. The operation in the synchronous mode will be described below.

Figure 11:
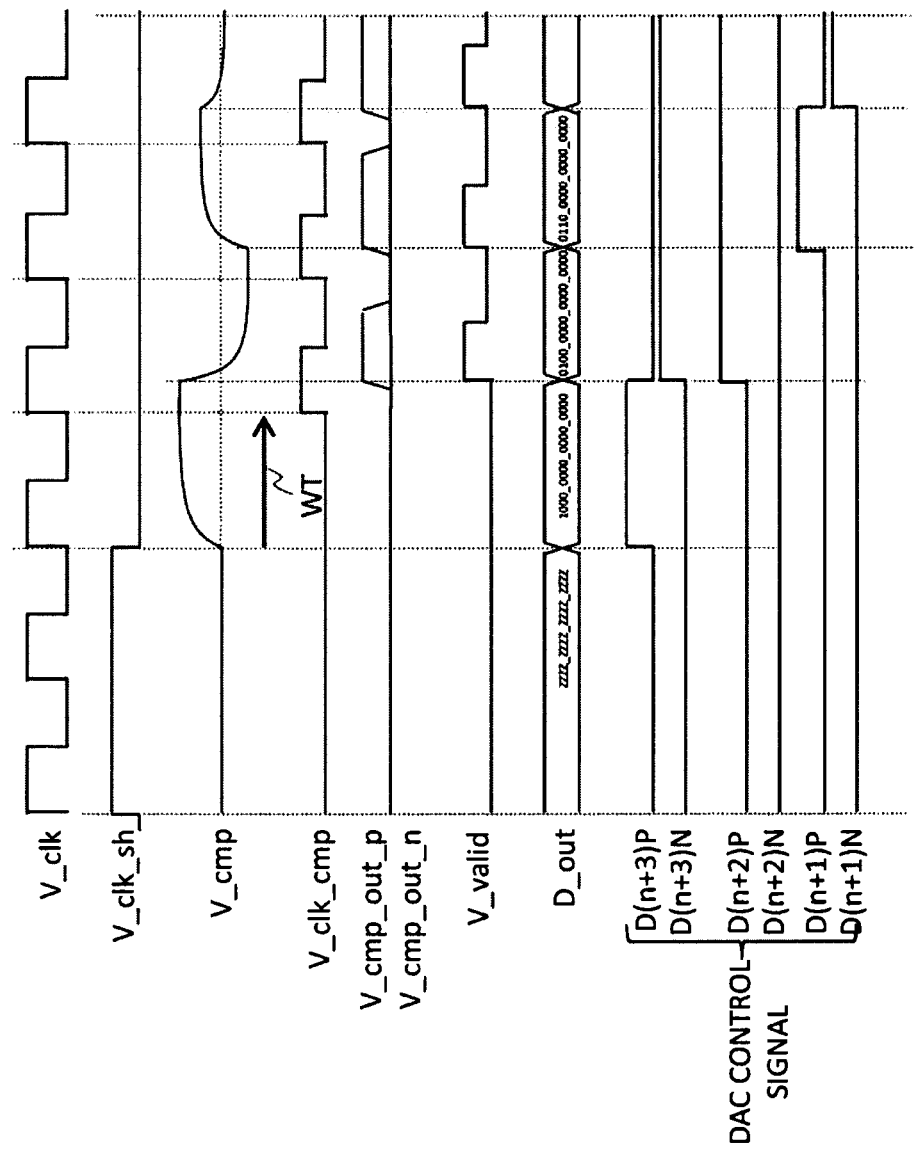
FIG. 11 is a waveform chart illustrating a time chart when the successive approximation AD converter according to the second embodiment is operated in the synchronous mode.

FIG. 11 is an operation time chart in the synchronous mode in the successive approximation of the second embodiment. The synchronous clock generation unit 118 waits for time WT in which one cycle of the output V_clk of the oscillation circuit elapses from the falling of the sample-and-hold clock V_clk_sh, and generates the comparator control clock V_clk_cmp (that is, the synchronous clock V_clk_cmp0'). That is, the output V_clk of the oscillation circuit is masked for one cycle. The synchronous clock V_clk_cmp0' is inputted to the comparator 108 via the selector 110, and the comparator 108 is operated after waiting for the time WT from the falling of the sample-and-hold clock V_clk_sh. Thereafter, the comparator 108 starts comparison at the timing of the rising of the comparator control clock V_clk_cmp.

With the predetermined delay from the rising of the comparator control clock V_clk_cmp, the comparator 108 completes the comparison, and the conversion completion signal V_valid rises. In the second embodiment, the conversion completion sign, V_valid also controls the fetching timing of the register SAR in the conversion result storage and DAC control logic unit 116 also in the synchronous mode.

According to the second embodiment, the operation of the register SAR is started by the conversion completion signal V_valid of the comparator, and meanwhile, the waiting time of the comparator input can be adjusted according to the cycle of the output signal V_clk of the oscillation circuit.

Figure 12:
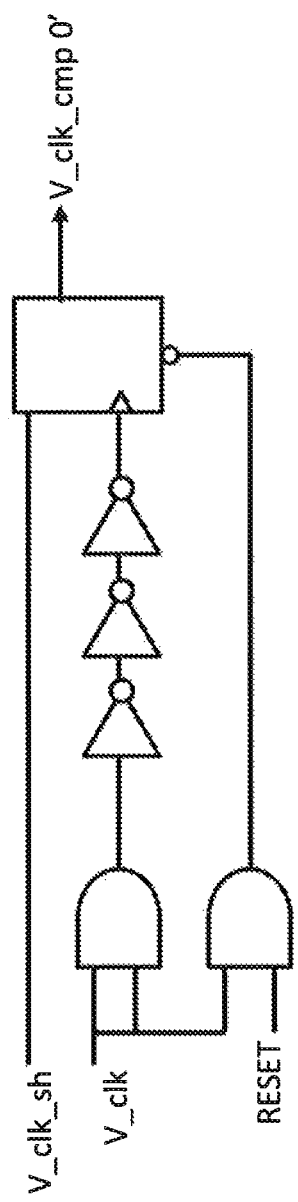
FIG. 12 is a circuit diagram illustrating an example of a clock generation unit according to the second embodiment.

FIG. 12 illustrates an example of a circuit that passes the V_clk as the synchronous clock V_clk_cmp0' after the elapse of one cycle of the output signal V_clk of the oscillation circuit from the falling of the sample-and-hold clock V_clk_sh. This circuit is given as an example, and various known methods are applicable to any circuit that has the same function.

According to the embodiments that have been described above, in the operation at a relatively low resolution in which the delay time can be short, the asynchronous mode can be selected. In the asynchronous mode, the high-speed clock (V clk) is not required, so that the highest operation frequency can be lowered, and in particular, the effect of improving the IC electric power efficiency at high speed (high sampling rate) can be provided.

Meanwhile, in the operation at a relatively high resolution, the synchronous mode that can arbitrarily set the delay time can be selected. In particular, at the relatively high resolution and low speed (low sampling rate), the DAC electric power in the AD converter is more dominant than the electric power of the clock distribution portion, so that the advantage of the wide control range by the synchronous type is great as compared with the lowering of the IC electric power efficiency.

Of course, the selectors 110 and 114 for switching between the synchronous mode and the asynchronous mode can be manually switched, but in consideration of the above characteristic, a threshold value S1 (S1 is a natural number) may be provided in the resolution, that is, the number of stages of the variable sample-and-hold circuit, the synchronous mode can be automatically selected when the number of stages of the sample-and-hold circuit is equal to or more than the S1, and the asynchronous mode can be automatically selected when the number of stages of the sample-and-hold circuit is less than the S1. Alternatively, a threshold value S2 (S2 is a natural number) may be further provided in the sampling rate. The AD converter is basically operated in the asynchronous mode, but only when the number of stages of the sample-and-hold circuit is equal to or more than the threshold value S1 and the sampling rate is less than the S2, the AD converter may be switched to the synchronous mode.

The present invention is not limited to the above embodiments, and includes various modifications. For example, part of the configuration of one of the embodiments can be replaced with the configuration of the other embodiment, and the configuration of one of the embodiments can be added with the configuration of the other embodiment. In addition, part of the configuration of each of the embodiments can be subjected to addition, deletion, and replacement with respect to the configuration of the other embodiment.

REFERENCE SIGNS LIST

V_clk_sh: Sample-and-hold clock
V_clk_cmp: Comparator control clock
V_clk_cmp0, V_clk_cmp0': Synchronous clock
V_clk_cmp1: Asynchronous clock
V_valid: Conversion completion signal
V_clk: Oscillation circuit output

The invention claimed is:

1. A successive approximation analog-to-digital converter that has:
   a plurality of capacitive elements that sample an analog input signal and have weighted capacitance values;
   a comparator that compares the analog input signal and a reference analog signal to output a comparison result;
   a plurality of registers that store digital data based on the comparison result; and
   a DAC that generates the reference analog signal based on the contents of the plurality of registers,
   wherein the analog input signal is converted to a digital code by successively changing the digital data based on the output of the comparator, the successive approximation analog-to-digital converter comprising:
- a first timing signal generation unit that generates a first timing signal based on the output of an oscillation circuit;
- a second timing signal generation unit that generates a second timing signal based on the state change of the output of the comparator; and
- a selector circuit that selects the first timing signal or the second timing signal to feed the selected timing signal to the comparator.

2. The successive approximation analog-to-digital converter according to claim 1, further comprising a control circuit that changes the number of the plurality of capacitive elements that sample the analog input signal, and changes the number of bits of the digital code.

3. The successive approximation analog-to-digital converter according to claim 2,
- wherein the control circuit switches the selector circuit with the changing of the number of bits of the digital code.

4. The successive approximation analog-to-digital converter according to claim 2,
- wherein the selector circuit selects the first timing signal when the number of bits of the digital code is equal to or more than a predetermined threshold value, and
- wherein the selector circuit selects the second timing signal when the number of bits of the digital code is less than the threshold value.

5. The successive approximation analog-to-digital converter according to claim 2,
- wherein the second timing signal generation unit has:
  - a logic circuit that generates a conversion completion signal based on the state change of the output of the comparator; and
  - a delay generation circuit that delays the conversion completion signal to generate the second timing signal.

6. The successive approximation analog-to-digital converter according to claim 5,
- wherein the second timing signal generation unit delays the timing of the sampling completion of the analog input signal to generate a first second timing signal, and delays the conversion completion signal to generate a second or subsequent second timing signals.

7. The successive approximation analog-to-digital converter according to claim 5,
- wherein the delay amount of the delay generation circuit is variable, and
- wherein the control circuit changes the delay amount with the changing of the number of bits of the digital code.

8. The successive approximation analog-to-digital converter according to claim 5,
- wherein a fetching timing of the data of the plurality of registers is controlled at a timing based on the first timing signal in a first mode in which the first timing signal is fed to the comparator, and
- wherein the fetching timing of the data of the plurality of registers is controlled at a timing based on the conversion completion signal in a second mode in which the second timing signal is fed to the comparator.

9. The successive approximation analog-to-digital converter according to claim 8, further comprising a selector for the registers for switching the timing signal fed to the plurality of registers,
- wherein the selector for the registers performs switching in synchronization with the selector circuit.

10. The successive approximation analog-to-digital converter according to claim 5,
- wherein a fetching timing of the data of the plurality of registers is controlled at a timing based on the conversion completion signal in the first mode in which the first timing signal is fed to the comparator, and
- wherein the fetching timing of the data of the plurality of registers is also controlled at a timing based on the conversion completion signal in the second mode in which the second timing signal is fed to the comparator.

11. A successive approximation analog-to-digital converter comprising:
- a digital-to-analog converter that generates an analog voltage based on a digital code;
- a comparator to which the analog voltage as the generated analog voltage from the digital-to-analog converter is inputted;
- a DAC control circuit that generates a digital code of an input voltage sampled from an external clock signal by successively changing the digital code based on an output of the comparator;
- a delay circuit that starts a determination of the comparator by signal transition generated by delaying a signal state change of the output of the comparator;
- a clock generation circuit that generates a signal starting the determination of the comparator; and
- a selector circuit that selects a signal generated by the delay circuit or a signal generated by the clock generation circuit to feed a selected signal to the comparator.

* * * * *